US007672161B2

(12) United States Patent
Hou et al.

(10) Patent No.: US 7,672,161 B2
(45) Date of Patent: Mar. 2, 2010

(54) ADAPTIVE DETECTION OF THRESHOLD LEVELS IN MEMORY

(75) Inventors: Ping Hou, Fremont, CA (US); Eugen Gershon, San Jose, CA (US); Michael A. Van Buskirk, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 333 days.

(21) Appl. No.: 11/742,371

(22) Filed: Apr. 30, 2007

(65) Prior Publication Data

US 2008/0266945 A1    Oct. 30, 2008

(51) Int. Cl.
*G11C 11/03*    (2006.01)
(52) U.S. Cl. .............................. 365/185.03; 365/185.24; 365/210.12; 365/241
(58) Field of Classification Search ............ 365/185.03, 365/185.24, 210.12, 241
See application file for complete search history.

(56) References Cited

U.S. PATENT DOCUMENTS

| | | | | |
|---|---|---|---|---|
| 6,580,653 | B2 * | 6/2003 | Yamanaka | 365/210.1 |
| 6,894,939 | B2 * | 5/2005 | Yamashita | 365/203 |
| 7,304,875 | B1 * | 12/2007 | Lien et al. | 365/49.1 |
| 2008/0019209 | A1 * | 1/2008 | Lin | 365/241 |

OTHER PUBLICATIONS

Sayood. "Introduction to Data Compression" Morgan Kaufmann Publishing, 1996.
Linde, et al. "An Algorithm for Vector Quantizer Design" (1980) IEEE Transactions on Communications vol. 28, No. 1, pp. 84-95.
Gray. "Vector Quantization" (1984) IEEE Acoustics, Speech, and Signal Processing Magazine vol. 1, No. 4, pp. 4-29.
Larcher, et al. "Statistical Simulations for Flash Memory Reliability Analysis and Prediction" (2004) IEEE Transactions on Electron Devices vol. 51, No. 10, pp. 1636-1643.
Desalvo, et al. "Experimental and Theoretical Investigation of Non-volatile Memory Data-Retention" (1999) IEEE Transactions on Electron Devices vol. 46, No. 7, pp. 1518-1524.
Janai, et al. "Data Retention Reliability Model of NROM Nonvolatile Memory Products" (2004) IEEE Transactions on Device and Materials Reliability vol. 4, No. 3, pp. 404-415.

* cited by examiner

*Primary Examiner*—Pho M. Luu
(74) *Attorney, Agent, or Firm*—Turocy & Watson, LLP

(57) ABSTRACT

Systems, methods, and/or devices that facilitate accessing data from memory are presented. An adaptive detection component can be employed to reduce or minimize detection error and distinguish information stored in memory cells during read operations. A decoder component can include the adaptive detection component, which can employ an adaptive Linde-Buzo-Gray (LBG) algorithm. The decoder component can receive information associated with a current level from a memory location during a read operation, and can analyze and process such information. The adaptive detection component can receive the processed information and, along with other information, can process such information using the iterative LBG algorithm until reconstruction levels and corresponding threshold levels are determined. Such reconstruction levels and/or threshold levels can be compared to the value associated with the information read from the memory location to determine the data value of the data in the memory location.

20 Claims, 8 Drawing Sheets

ADAPTIVE DETECTION OF THRESHOLD LEVELS IN MEMORY

BACKGROUND

A wide variety of memory devices can be used to maintain and store data and instructions for various computers and similar systems. In particular, flash memory is a type of electronic memory media that can be rewritten and that can retain content without consumption of power. Flash memory has become popular, at least in part, because it combines the advantages of the high density and low cost of erasable programmable read only memory (EPROM) with the electrical erasability of electronically erasable programmable read only memory (EEPROM). Flash memory is non-volatile; it can be rewritten and can hold its content without power. It is used in many portable electronic products, such as cell phones, portable computers, voice recorders, thumbnail drives and the like, as well as in many larger electronic systems, such as cars, planes, industrial control systems, etc. The fact that flash memory can be rewritten as well as its retention of data without a power source, small size and light weight have all combined to make flash memory devices useful and popular means for transporting and maintaining data.

As flash memory devices have continued to evolve, the density of data stored in such devices is increased. With the increasing density of data, read errors can be increased due in part to the close proximity of read threshold levels. Further, as erase cycles increase, read errors can occur more frequently. It is desirable to maintain or improve the accuracy and reliability of flash devices. Further, when an error correction code component is also employed, it is desirable to reduce the workload for the error correction code component and thereby reduce any potential read latency associated therewith as well as reduce the gate count for implementation.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems and/or methods that facilitate accessing data in memory devices. In accordance with one aspect of the disclosed subject matter, a decoder component can be employed to facilitate reading data from a memory, such as non-volatile memory (e.g., a flash memory). The decoder component can include a detection component that can adaptively detect the various threshold levels in a memory cell within a memory device. With the detection component being able to adaptively detect the various threshold levels in the memory device, the decoder component can distinguish information stored within the cell, and such information can then be read from the memory device.

In accordance with one embodiment of the disclosed subject matter, the decoder component can include a detection component that can employ an adaptive algorithm (e.g., Linde-Buzo-Gray (LBG) algorithm) that can facilitate detecting the threshold levels of a memory cell in a memory device, such as a flash memory device. The detection component can sense the strength of a received signal and can intelligently define the detection threshold levels of a multi-level memory cell based on information associated with the received signal.

Employing the LBG algorithm, the detection component can, for example, begin with an initial set of reconstruction level values, where a reconstruction level value can correspond to a desired read current for charged cells. The detection component can perform calculations in accordance with the LBG algorithm to obtain a result associated with the accuracy of the current iteration. If the accuracy of the current iteration is below a predetermined accuracy threshold level for termination, then the reconstruction levels of the memory cell are detected; moreover, such reconstruction levels can yield threshold levels that can be used to determine signals at each iteration. If the accuracy is not below the predetermined accuracy threshold level for termination, then one or more subsequent iterations can be performed, where new reconstruction levels can be determined and calculations performed in accordance with the LBG algorithm, until either the reconstruction levels are detected, or a maximum number of iterations have been performed without reaching the desired accuracy threshold level, in which case the reconstruction levels associated with the final iteration can be the detected reconstruction levels.

The detected reconstruction levels can be used to detect the threshold levels associated with the memory cell, as a threshold level can be the midpoint between two adjacent reconstruction levels, for example. The detected threshold levels can then be used to determine the data values associated with the information read from the memory location.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
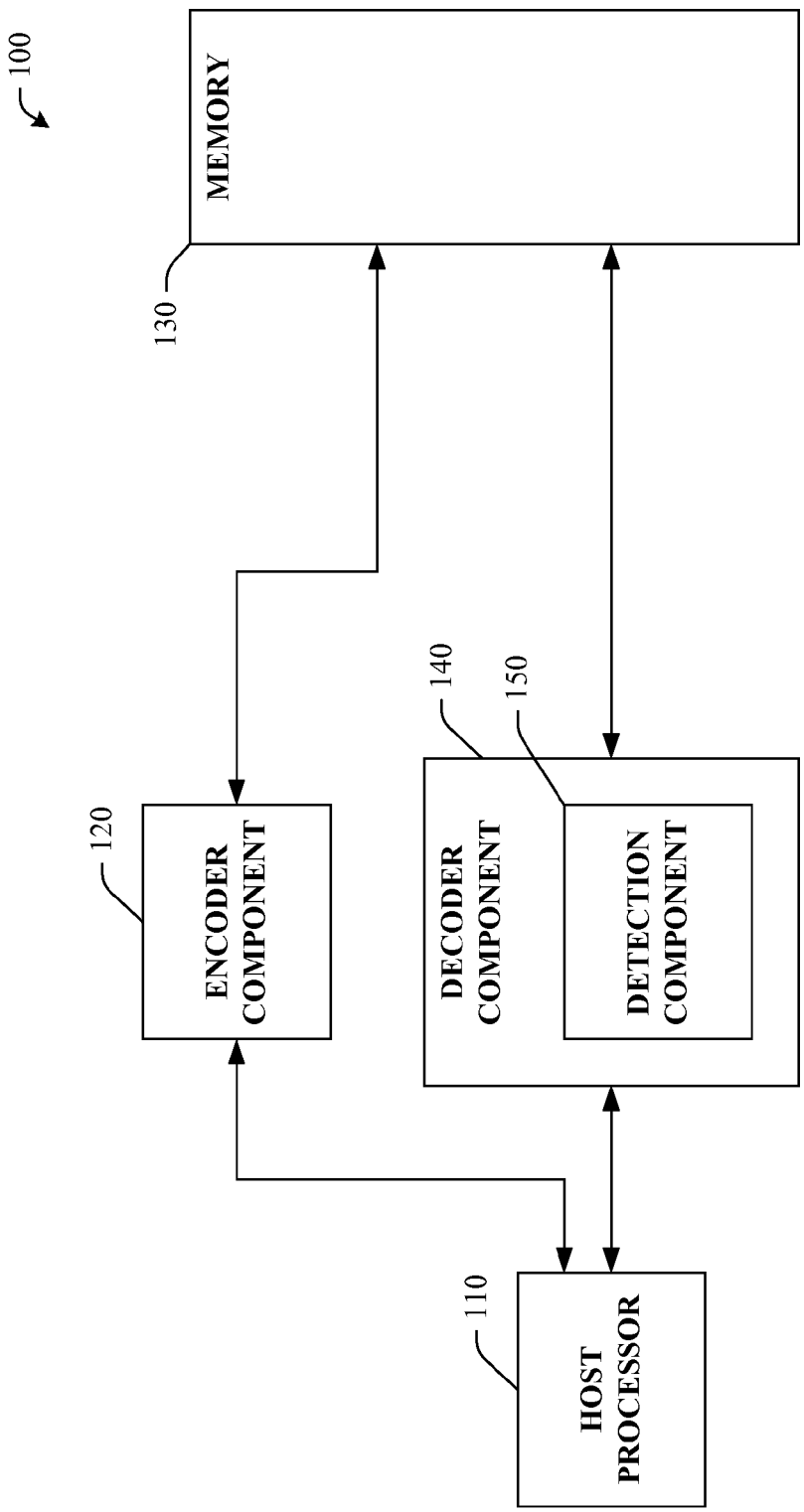
FIG. 1 illustrates a system that facilitates accessing data in a memory in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

As utilized herein, terms "component," "system," "interface," "engine," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Flash memory devices have become popular because such devices have certain advantages such as high density, electrical erasability, and low cost. It is desirable to maintain or improve the accuracy and reliability of flash devices. Further, it is desirable to reduce the workload for the error correction code component and thereby reduce any potential read latency associated therewith as well as reduce the gate count for implementation.

The disclosed subject matter relates to systems and/or methods that facilitate accessing data in memory devices. In accordance with one aspect of the disclosed subject matter, a decoder component can be employed to facilitate reading data from a memory, such as non-volatile memory (e.g., a flash memory). In accordance with one embodiment of the disclosed subject matter, the decoder component can include a detection component that can employ an adaptive algorithm (e.g., Linde-Buzo-Gray (LBG) algorithm) that can facilitate detecting the threshold levels of a memory cell in a memory device, such as a flash memory device. The detection component can sense the strength of a received signal and can intelligently define the detection threshold levels of a multi-level memory cell, even if such threshold levels have been changed over time due in part to the memory cell being subject to erase cycles, reference cell shifting and narrowing window for read, and/or other factors.

Now turning to the figures, FIG. 1 depicts a system that facilitates accessing data from memory in accordance with the disclosed subject matter. System 100 can include a host processor 110, which can be a typical applications processor that can manage communications and run applications. System 100 can further include an encoder component 120 that can encode data being written to memory 130. Encoder component 120 can be an encoder, for example, and can charge a memory cell in a memory location in memory 130 with a current that can correspond with the binary data being written to memory 130, such that the current level can correspond to a reconstruction level value in the memory cell. During a subsequent read operation, the threshold level value can correspondingly be obtained with a given reconstruction level value that can be achieved from the current level, associated with a corresponding data value, that is being stored in memory 130.

Memory 130 can include non-volatile memory, such as flash memory, read only memory (ROM), programmable ROM (PROM), erasable programmable read only memory (EPROM), electronically erasable programmable read only memory (EEPROM), and the like. For example, memory 130 can be a non-volatile memory (e.g., flash memory, multi-bit flash memory) that can include multi-level, multi-bit flash memory cells, where each bit, or a combination of multiple bits, of a memory cell can be programmed to multiple target values of levels. For example, four distinct levels (e.g., L1, L2, L3, and L4) corresponding to varying amounts of charge can represent two bits of information, where L1 can be the lowest or unprogrammed state correspondingly having the lowest amount of charge stored, and L4 can be the highest state correspondingly having the highest amount of charge stored. Therefore, a memory cell that maintains two sides with four levels employed on each side, where two data bits can be represented by any of four possible levels of charge, can be programmed for sixteen distinct states.

Each level can correspond to a respective data value, so that when the binary data is written to a memory cell, the memory cell can be charged such that the current level stored therein can correspond to the binary data being written to the memory. Threshold levels can be derived from reconstruction levels, where a threshold level can be a point between two reconstruction level values. Further, when data is read from memory 130, the current level stored in a memory cell can be determined and compared to the distinct threshold levels of the memory cell to facilitate determining the data value of the data stored in the memory cell.

System 100 can further include a decoder component 140 that can decode data that is read from memory 130. As erase cycles increase, memory, such as flash memory, can result in read errors. Further, adjacent levels within a cell in such memory can have overlap which can result in read errors. To reduce or minimize read errors, decoder component 140 can include a detection component 150 that can adaptively determine the threshold levels within a cell. The detection component 150 can determine threshold levels in a memory cell in response to variant cell behavior to distinguish information that is stored within a memory cell.

According to one embodiment of the disclosed subject matter, the detection component 150 can be an LBG detector that, for a given data set, can provide a number of reconstruction levels for which decision error can be minimized. The given data set can be associated with the current read from the memory cell associated with the read operation being performed. The reconstruction levels can be derived from the data set. Further, the detection component 150 (e.g., LBG detector) can be iterative, where detection component 150 can perform multiple iterations until either the values of the threshold levels in the memory location are detected or a pre-defined maximum number of iterations has been performed. If the values of the threshold levels have been detected or determined by the detection component 150, such detected threshold value can be utilized to decode the information being read from memory 130. Decoder component 140 can then decode the information being read from memory and provide the decoded information to the host processor 110.

Figure 2:
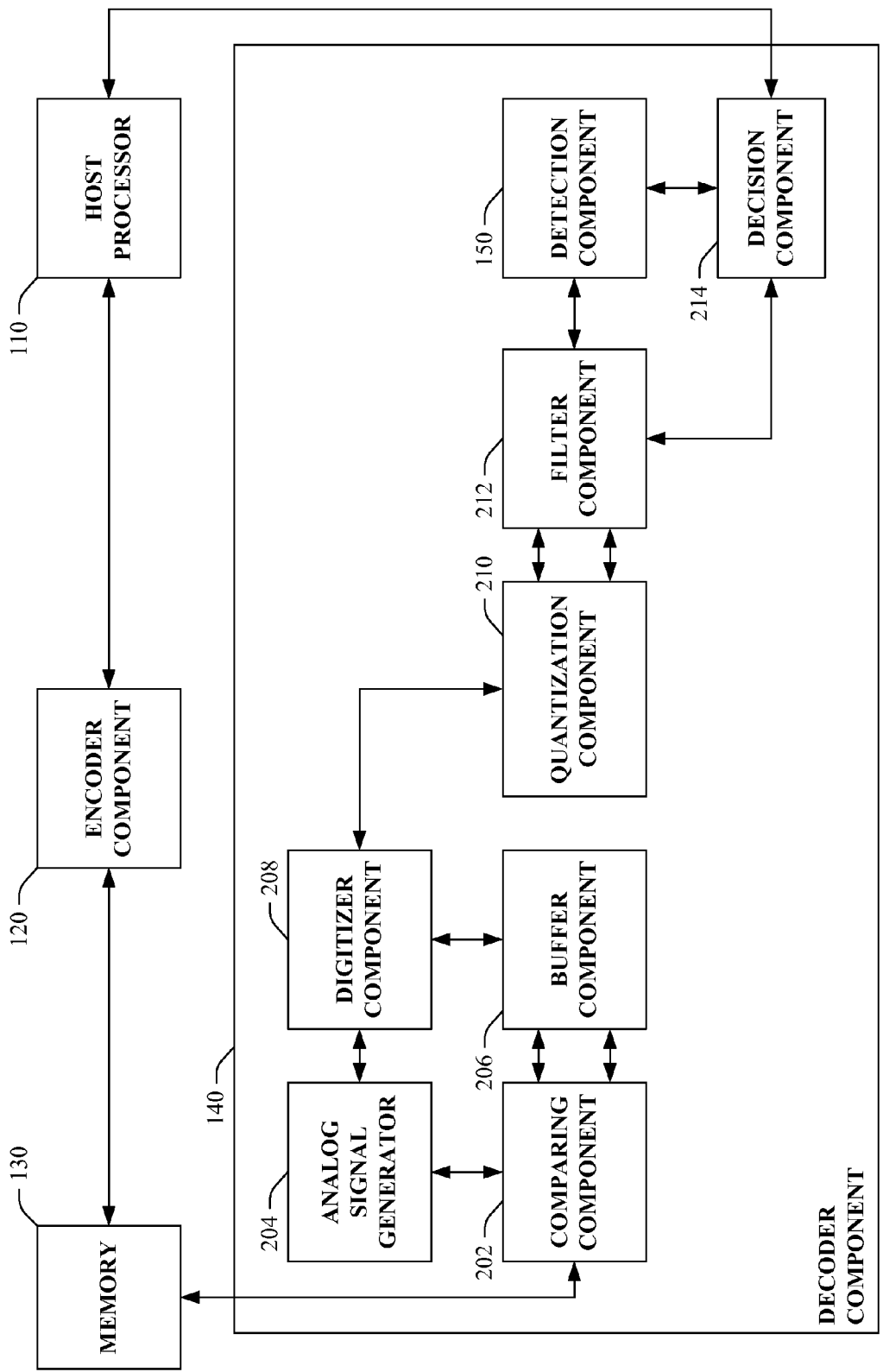
FIG. 2 illustrates a system that facilitates accessing data in a memory in accordance with an aspect of the subject matter disclosed herein.

Turning to FIG. 2, a system 200 that facilitates accessing data from memory in accordance with the disclosed subject matter is illustrated. System 200 can include a host processor 110 which can be a typical applications processor that can manage communications and run applications. System 200 can further include an encoder component 120 that can encode data being written to memory 130. Encoder component 120 can be an encoder, for example, and can convert the data to a current level that can be utilized to store electrons in a memory location in memory 130. During a subsequent read operation, current that can correspond to stored electrons in the memory cell associated with the memory location can be sensed, where the stored electrons can be utilized to reproduce data. It should be noted that the reproduced data value associated with the current level read out of the memory location can be the same as, or a different from, the original data value as written to the memory location in memory 130.

Memory 130 can include non-volatile memory, such as flash memory, ROM, PROM, EPROM, EEPROM, and the like. In accordance with one aspect of the disclosed subject matter, the memory 130 can be a flash memory comprised of multi-level, multi-bit flash memory cells (e.g., MirrorBit® quad-bit flash memory), where multiple bits of data can be stored in each memory cell.

System 200 can further include a decoder component 140 that can facilitate decoding data being read from memory 130. In accordance with one embodiment of the disclosed subject matter, decoder component 140 can include a comparing component 202 that can receive one or more signals (e.g., current levels) from memory 130. The signals can be a current or respective currents read from respective memory locations in a memory cell associated with respective read operations being performed to read data from such locations in memory 130.

Comparing component 202 can also be associated with a signal component 204 that can generate analog signals that can be associated with a variety of current levels. So that the current read from memory 130 can be compared to each of a plurality of analog signals respectively associated with a plurality of current levels, where such analog signals can be generated in a variety of ways, such as by setting up different voltages, or by setting up a different inductance or capacitance at the same voltage. Comparing component 202 can compare the one or more signals (e.g., current levels) received from memory 130 with each of the analog signals received from the signal component 204, and can generate an output that can be one or more N-bit binary sequences that can indicate which of the N-band signals values are exceeded by the detected current, where N, similar to signal resolution, can be based on the number of bits associated with a respective detected current from a memory cell, for example. Further, comparing component 202 can generate multiple (e.g., P) N-bit binary sequences where P can be associated with the number of memory cells associated with the read operation(s). For example, each of the incoming current signals to comparing component 202 can be compared to the generated analog signal and the results from comparing component 202 can be a 0 or a 1 based on whether the current level of the incoming current signal is greater than the current level of the analog signal or not (e.g., 1 if greater, 0 if less). The output signal for each compared signal can be a 0 or 1 and can be provided as output.

As an example, assume there are eight analog signals from the signal component 204 with respective values of 1.0, 2.0, 3.0, 4.0, 5.0, 6.0, 7.0, and 8.0 mA, and the detected current from a memory cell in memory 130 corresponds to a value of 3.4 mA, comparing component 202 can generate a binary sequence of 0000 0111, since 3.4 mA exceeds 1.0, 2.0, and 3.0 mA, so a 1 can be generated by the comparing component 202, but 3.4 mA does not exceed 4.0, 5.0, 6.0, 7.0, and 8.0 mA, so a 0 can be generated by the comparing component 202.

It should be noted that, typically, the more memory cells that can be associated with a particular determination or detection of reconstruction levels and threshold levels of the memory cells, the more accurate the detection results that can be expected.

The comparing component 202 can further be associated with a buffer component 206 that can receive the output from the comparing component 202. The buffer component 206 can store data associated with P N-bit binary sequences in its buffer until all such sequence data associated with the read operation(s) has been received by the buffer component 206. That is, if, during a particular read operation(s), data in 100 memory cells are being read from memory 130, then P can equal 100, and 100 N-bit binary sequences can be generated by the comparing component 202 and output to the buffer component 206, where such sequences can be stored until all (e.g., P) N-bit binary sequences have been received by buffer component 206.

Signal component 204 and buffer component 206 also can be associated with a digitizer component 208, which can include a mapping table with a plurality of indexes (e.g., binary sequences). Digitizer component 208 can receive information associated with each of the binary sequences stored in buffer component 206, as well as information associated with the analog signal generated by signal component 204 that corresponds with a particular binary sequence. Digitizer component 208 can utilize such information to reference or look up an indexed binary sequence in a mapping table in digitizer component 208 that can correspond to the particular binary sequence from buffer component 206 and/or the corresponding analog signal from signal component 204. The corresponding indexed binary sequence can be a binary sequence that represents a desired output from the memory location in memory 130. The digitizer component 208 can then provide the corresponding indexed binary sequence to quantization component 210.

For example, from the previous example, where the current level detected in the memory location in memory 130 is 3.4 mA, a binary sequence of 0000 0111 can be generated by comparing component 202 and stored in buffer component 206. Further, since the analog signal of 3.0 mA was the highest current level that was exceeded by the detected current, the analog signal of 3.0 mA can be a corresponding analog signal and such information can be received by digitizing component 208. Digitizing component 208 can use the information associated with the corresponding analog signal and information regarding the corresponding binary sequence in buffer component 206 to map the corresponding analog signal and binary sequence to an indexed binary sequence in the mapping table in digitizing component 208. For example, referencing the analog signal of 3.0 mA, and/or the binary sequence of 0000 0111, in the mapping table may show that the corresponding indexed binary sequence is 1001 0001, for example. The corresponding indexed binary sequence can thus be a fixed-point constant digital signal derived from the mapping list or table. The corresponding indexed binary sequence of 1001 0001, for example, can then be generated as an output. Thus, P N-bit indexed binary sequences can correspondingly be generated for the P N-bit binary sequences that were stored in buffer component 206.

Decoder component 140 can include a quantization component 210 that can receive the P N-bit binary sequences (e.g., corresponding P N-bit indexed binary sequences) from the digitizing component 208. Each N-bit binary sequence can be quantized by quantization component 210 to reduce the number of bits per sequence. Reducing the number of bits per sequence can facilitate reducing the work load on other components (e.g., filter component 212) in system 200. After quantizing, quantization component 210 can then generate P N'-bit binary sequences, where N' can represent the number of bits, depicting detected current, of a binary sequence that remains after quantization.

For example, 100 8-bit binary sequences can be input into quantization component 210 from digitizer component 208, where such sequences can represent detected current from memory cells. Quantization component 210 can reduce the number of bits per binary sequence to five bits, so that the output from component 210 can be 100 5-bit binary sequences (e.g., binary sequences corresponding to current), such that reducing the number of bits per sequence to N' (e.g., 5) bits does not cause an undesirable level of error when calculating reconstruction levels and threshold levels. The level of quantization, that is, the number of bits to be reduced, can be predetermined, for example, through testing and/or simulation, such that any error associated with the quantization can be reasonably known so that the quantization can be set to meet desired accuracy levels.

Turning back to the previous example, the binary sequence, 1001 0001, can be received by quantization component 210, where the binary sequence can be obtained from the mapping table within digitizer component 208 as a given index based on the sequence received from buffer component 206, can be received by quantization component 210. Quantization component can quantize that binary sequence by removing the last three bits, for example, which can yield a quantized binary sequence of 10010. It is to be appreciated that quantizing a binary sequence to reduce it by three bits so that five bits remain is for example purposes only, and the level of quantization can be any amount that can facilitate detection of reconstruction levels and threshold levels of memory cells in memory 130 with sufficient and/or satisfactory resolution.

Decoder component 140 can further include a filter component 212 that can be associated with quantization component 210. Filter component 212 can receive P N'-bit binary sequences from the quantization component 210. According to one aspect of the disclosed subject matter, the filter component 212 can employ low-pass filtering on the P signals (e.g., quantized binary sequences) and can filter out high-frequency noise and disturbance so as to obtain more accurate representations for the threshold levels of the memory cell. In general, the number of signals (e.g., P) input to filter component 212 can be the same number (e.g., P) at the output of filter component 212, the output value associated with the signals (e.g., P signals) from the filter component 212 can have a different value from the signals (e.g., P signals) that were input to the filter component 212 due to the filtering. Further, the number of bits per signal (e.g., N') input to filter component 212 may or may not be the same number (e.g., may be N'') as the output from the filter component 212, Decoder component 140 can include a detection component 150 that can adaptively detect the reconstruction levels and threshold levels of memory cells in memory 130 from which data is being read to thereby distinguish information that is stored within the memory cells. The detection component 150 can adaptively detect the threshold levels by starting with an initial set of reconstruction level values and performing iterations until a desired accuracy is attained or a maximum number of iterations is performed. The detection component 150 can specify a predetermined accuracy threshold level below which a particular set of reconstruction levels would be considered to have attained a desired accuracy. Threshold levels can be derived from the detected reconstruction levels. The initial reconstruction level values can be based on and/or derived from the P signals received from the filter component 212, for example, where each of the P signals can be respectively associated with the current(s) read or received from the memory location(s) from which data is being read. An initial distortion level can be specified as well, and can be set to zero, for example.

The detection component 150 can also identify decision regions based on the data (e.g., quantized binary sequences) received from the filter component 212. The decision regions can also be based in part on the reconstruction levels associated with the particular iteration. For example, a decision region can be the region from 0 (or some lower limit) to a first threshold level that can correspond to or be determined from two adjacent reconstruction levels; a decision region can be the region between two threshold levels which can be determined from corresponding reconstruction levels; or a decision region can be a region that extends beyond the highest threshold level, which can be determined from corresponding reconstruction levels. Thus, the decision regions can be areas or regions that can be respectively associated with each of the levels of a memory cell.

Further, detection component 150 can calculate a distortion level associated with the decision regions. The distortion level can be used to determine whether the accuracy threshold has been reached. For example, the difference between the current distortion level and the previous distortion level (or, if no previous, then an initial distortion level) can be calculated and then divided by the current distortion level; if the result is less than the accuracy threshold level, a determination can be made that the desired accuracy has been reached and the reconstruction levels are detected. Information associated with the detected threshold levels can be provided as output by the detection component 150. Ultimately, the detected reconstruction levels can be used to determine the desired threshold levels associated with the memory cell and thereby determine the data values of data stored in the memory cell.

If, however, the result is not below the accuracy threshold level, then a determination can be made that the desired accuracy threshold has not been reached, and a new iteration can be performed. For the new iteration, a new set of reconstruction levels can be determined based on the centroids of the decision regions of the previous iteration, for example. The new iteration can then proceed with the detection component 150 determining new decision regions based on the new reconstruction levels, calculating a distortion level, and determining whether the accuracy threshold level has been met. The detection component 150 can continue to perform the iterations until the accuracy threshold level has been met or a maximum number of iterations have been performed. If the maximum number of iterations is performed without reaching the desired accuracy threshold level, the detection component 150 can stop performing iterations, and a determination can be made that the optimal reconstruction levels were not detected by the detection component 150. Under such circumstances, the reconstruction levels of the final iteration, while suboptimal, can be chosen as the detected reconstruction levels. Information associated with the chosen detected threshold levels can be provided as output by the detection component 150.

In accordance with one embodiment of the disclosed subject matter, the detection component 150 can employ an adaptive LBG algorithm that can facilitate determining the threshold levels of a memory cell in memory 130 (e.g., flash memory). Employing the LBG algorithm, the detection component 150 can provide a finite number of reconstruction levels for which the decision error can be minimized, with regard to a given data set, where the data set can be information associated with the read current associated with a read operation. Generally, the more memory cells that are included for consideration, the better the result that can be expected.

The detection component 150 can adaptively detect the threshold levels of a memory cell in memory 130 from which data is being read to thereby distinguish information that is stored within the memory cell. The detection component 150 can adaptively detect the threshold levels by starting with an initial set of reconstruction level values. For example, assuming M reconstruction levels (mean value for current read distributions for a given gate voltage), an initial set of reconstruction level values $\{Y_i(0)\}$ (e.g., mean value for current read distributions for a given gate voltage) can be determined, where $Y_i$ can be the reconstruction level values and $i=1, \ldots, M$. The initial reconstruction level values can be based on and/or derived from the P signals received from the filter component 212, where each of the P signals can be respectively associated with the currents read or received from the memory locations in memory 130 from which data is being read. Further, choosing appropriate initial reconstruction level values can facilitate decreasing the number of iterations to detect the threshold levels of the memory cell, further resulting in the desired threshold levels being detected in less time than otherwise may be required.

Other initial values can be set, such as setting the iteration number $k=0$, and distortion $D(0)=0$. An accuracy threshold level, $\epsilon$, can also be selected, and can be predetermined as desired. The accuracy threshold level can be compared to an amount or percentage change in distortion levels based on current, previous, and/or initial distortion values, as disclosed below, and, if the accuracy threshold level is attained, the threshold levels of the memory cell in memory 130 have been detected.

LBG detection component 150 can also identify decision regions that can be based on the data received from the filter component 212. A decision region can be a region where any data values (e.g., associated with a read current) that fall within the region can correspond to a certain binary data value that can represent the data read from a memory location. A decision region can be a region that is situated between two points, such as a lower limit and a first threshold level; two adjacent threshold levels; or a highest threshold level and an upper limit, for example, for a four-level case. For example, detection component 150 can calculate the following equation, when employing the LBG algorithm, $V_i(k)=\{X: d(X, Y_i) < d(X, Y_j)$ for any j different from i$\}$, $j=1, 2, \ldots, M$, where $V_i$ can be the decision regions, X can be the incoming current signal, $Y_i$ can be a desired or optimal reconstruction levels for detection for the current iteration, i can correspond to an index, and j can correspond to an index.

Further, LBG detection component 150 can calculate a distortion level associated with the decision regions. The distortion level, D(k), can be used to determine whether the accuracy threshold has been reached. For example, when employing the LBG algorithm, the distortion can be computed for each k, as follows:

$$D(k) = \sum_i \int_{Vi(k)} |X - Y|^2 f_X(X) dX$$

for $i=1, 2, \ldots, M$, where $f_X(X)$ can be the probability distribution function of the signal.

Based on the distortion, a determination can be made as to whether the accuracy threshold, $\epsilon$, has been met. For example, when employing the LBG algorithm, the following calculation and determination can be performed by LBG detection component 150: $(D(k)-D(k-1))/D(k) < \epsilon$. If a determination is made that the difference in distortion levels divided by the current distortion level is less than the accuracy threshold level, the desired accuracy has been reached and the reconstruction levels are detected, where the detected reconstruction levels can be the reconstruction levels that were used during that iteration. Detection component 150 can stop the iterations at this point, and information associated with the detected reconstruction levels can be provided as output by the detection component 150.

If, however, a determination is made that such result is not below the accuracy threshold level, $\epsilon$, then the desired accuracy threshold has not been reached, and another iteration can be performed. For the next iteration, k can be incremented as follows: $k=k+1$; further, new reconstruction levels $\{Y_i(k)\}$ can be determined, where such reconstruction levels can be the centroids of the decision regions of the previous iteration, $\{V_i(k-1)\}$, where $i=1, \ldots M$. Further, calculations of decision regions, distortion, and other calculations in accordance with the above-stated equations, can be performed for the new k (e.g., $k=k+1$) associated with the current iteration.

The detection component 150 can continue to perform iterations until $D(k)-D(k-1))/D(k) < \epsilon$, or a predetermined maximum number of iterations have been performed. If the maximum number of iterations is performed without reaching the desired accuracy threshold level, the detection component 150 can stop performing iterations, and a determination can be made that the optimal reconstruction levels were not detected by the detection component 150. Under such circumstances, the reconstruction levels of the final iteration, while suboptimal, can be chosen as the detected reconstruction levels. Information associated with the chosen detected reconstruction levels can be provided as output by the detection component 150.

As an example of detecting reconstruction levels, to determine a detected reconstruction level of a memory cell, an initial reconstruction level value may be determined or chosen to be 2.00 mA. After a first iteration, the reconstruction level value may be 2.20 mA. Assuming that accuracy threshold value is not met, a second iteration can be performed. After a second iteration, the reconstruction level value may be 2.22 mA. Assuming the accuracy threshold level has been met, the detected reconstruction level value can be equivalent to the reconstruction level value for the second iteration, which is 2.22 mA.

Decoder component 140 can also employ a decision component 214 that can receive as input information (e.g., signals or quantized binary sequences) from the filter component 212 and also can receive as input information from the detector component 150. The decision component 214 can utilize such information to determine which reconstruction level the signal associated with the read current belongs. For example, decision component 214 can receive one or more quantized binary sequences associated with the read current that was read from the memory location in memory 130. Decision component 214 can also receive the detected reconstruction levels from detector component 150. With such information, the decision component can determine which detected reconstruction level corresponds with the read current. For example, the determination by the decision component 214 can be based on comparing the differences between the current level value associated with the quantized binary sequences and the detected reconstruction levels, and choosing the detected reconstruction level that is closest in value to the current level. The decision component 214 can provide the corresponding detected reconstruction level as an output that can be sent to the host processor 110.

For example, assume four reconstruction levels have been detected for a memory cell in memory 130, and those detected reconstruction levels are 1.0 mA, 2.0 mA, 3.0 mA, and 4.0 mA, respectively. If distance is used for decision making, three threshold values can be determined to be 1.5 mA, as the midpoint between 1.0 and 2.0 mA; 2.5 mA, as the midpoint between 2.0 and 3.0 mA; and 3.5 mA, as the midpoint between 3.0 and 4.0 mA. Further assume that a quantized binary sequence associated with a read current corresponds to a value of 2.375 mA. Decision component 214 can analyze and/or compare the read current value to the detected reconstruction levels. Since the read current value of 2.375 mA is closer to reconstruction level of 2.0 mA than it is to reconstruction level of 3.0 mA, the decision component 214 can determine that reconstruction level of 2.0 mA is the corresponding level, and decision component 214 can decode the signal into the number 1 (or equivalently 01 in binary notation). The decoded signal can then be output from the decoder component 140 and sent to the host processor 110.

In accordance with one embodiment of the disclosed subject matter to optimize performance and reduce the cost of implementation, many calculations, such as the multiplication and division calculations, can be replaced with a look-up table(s) that can include calculations associated with the above LBG algorithm, plus compensation values.

In accordance with another embodiment of the disclosed subject matter, an alternative approach can be employed with regard to multi-bit flash memory devices. For example, with certain quad-bit flash memory devices, such as a MirrorBit® quad-bit flash memory device, a cell within the device can have two sides, with two bits on each side. Since either side has two bits or four possible levels, such a cell can contain sixteen states, where the sixteen states can be considered the whole signal space. The properties and correlation between the two sides can be predetermined prior to developing a detection system (e.g., system 200), and such information regarding the properties and correlation between the two sides can be utilized to take corresponding measures when designing the decoder component 140.

For example, with regard to a MirrorBit° quad-bit flash memory with sixteen states, each of the sixteen states can be determined by threshold levels on two locations (one on each of the left and right sides of a quad-bit memory cell). Using a two-dimensional coordinate (x,y), where x and y can be any of four levels on each side, sixteen states can be assigned. The signals or samples can be two-dimensional rather than a scalar.

The filter component 212 (e.g., low-pass filter) can be designed so that it can provide different filtering based on the particular state being filtered. Since certain states can be correlated to certain other states, the assumption of independence may not hold anymore. Therefore, different states, which can be represented by (x,y), can possibly have different filters. Further, the design of filter component 212 can be based on priori knowledge of quad-bit memory cell behavior and/or consideration of the detection component 150, as discussed below.

Further, the detection component 150 (e.g., LBG detector) can include an input that can be two-dimensional. For instance, if (x,y) and (x', y') satisfy y'−y=x'−x, detected signals from state (x,y) and (x',y') can have a substantially constant difference; and such knowledge of the observation can be incorporated into the design of filter component 212. Further, since it may be desirable for filtered-out signals to stay within a range suited for the detection component 150, such desired range of the detection component 150 can be accounted for in designing the filter component 212.

In accordance with one aspect of the disclosed subject matter, system 200 (as well as system 100), or portions thereof, can be included in various devices, such as a computer, a personal digital assistant (PDA), a cellular phone, a digital phone, an answering machine, a video device (e.g., television, or digital versatile disk (DVD) player/recorder), a music player/recorder (e.g., compact disc (CD) player, MP3 player, iPod®), a digital recorder, a digital camera, a microwave over, an electronic organizer, an electronic toy, an electronic game, a scanner/reader, and the like, as well as other peripheral devices (e.g., printer) or other electronic devices (e.g., a copy machine, a facsimile machine) that include a memory component.

Figure 3:
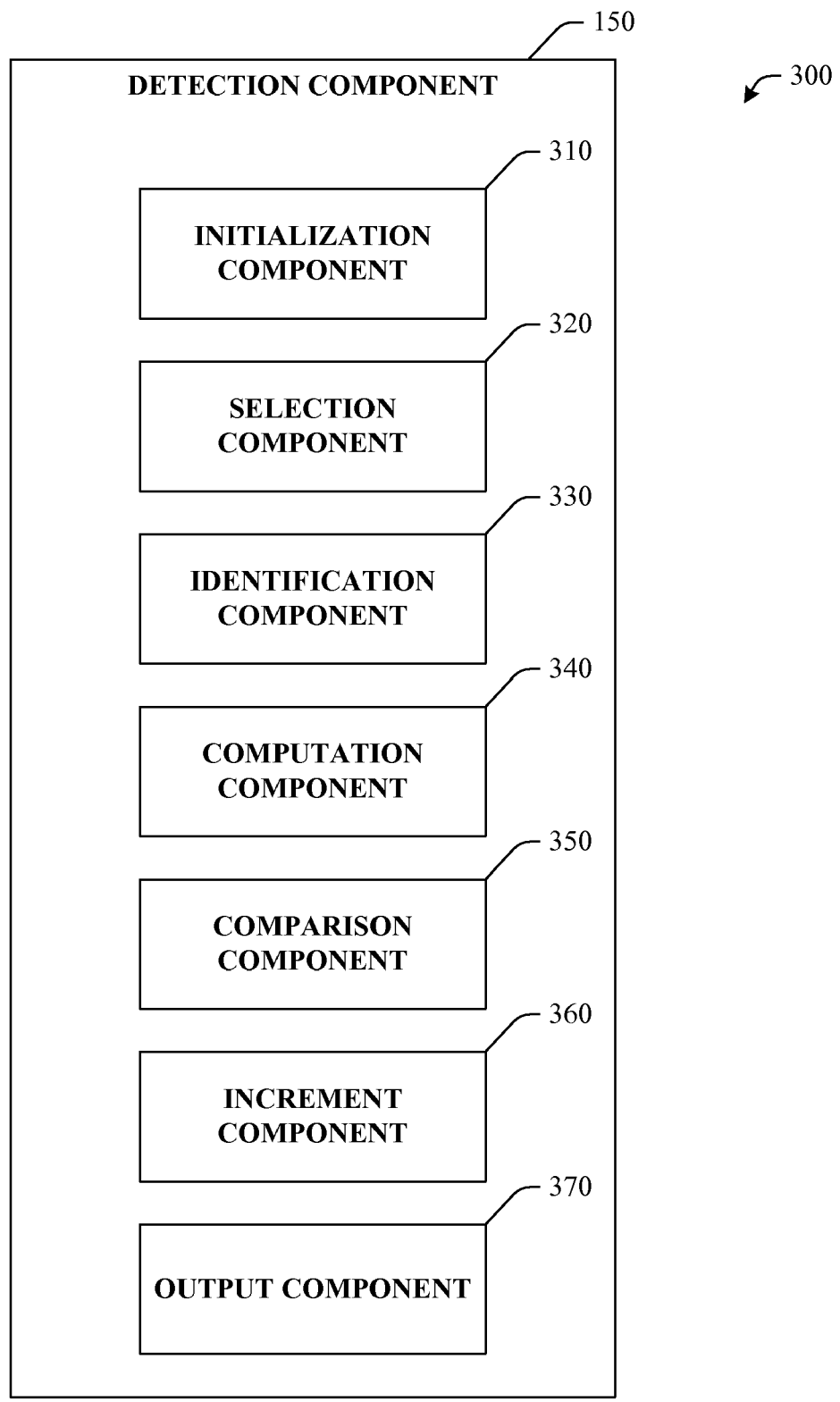
FIG. 3 illustrates a block diagram of a detector component in accordance with an aspect of the disclosed subject matter.

Turning to FIG. 3, a block diagram 300 of a detection component 150 in accordance with the disclosed subject matter is illustrated. Block diagram 300 depicts a detection component 150 that can include an initialization component 310 that can set certain variables to initial values, as the detection component 150 proceeds to detect threshold values in a memory cell during a read operation. For example, during a first iteration performed by the detector component 150, the initialization component 310 can determine an initial set of reconstruction level values $\{Y_i(0)\}$, where i=1, ..., M, that can be based on the read current level associated with the memory cell from which data is being read. Further, initialization component 310 can set iteration value k=0, and distortion value, D(0)=0, for example. In accordance with one aspect of the disclosed subject matter, detection component 150 can employ an LBG algorithm utilizing the above-stated initial values.

Further, initialization component 310 can determine and/or obtain a subsequent set of reconstruction levels, iteration levels, and distortion levels, that can be utilized for each subsequent iteration, if desired. For example, if a first iteration at k=0 does not yield a desired detection of reconstruction levels, then k can be incremented to 1, and initialization component 310 can obtain that iteration value of 1 to be used as desired in calculations during the next iteration. Also, initialization component 310 can determine a new set of reconstruction levels for the new iteration based on the centroids associated with the decision regions associated with the previous iteration. Further, initialization component 310 can obtain the distortion level from the previous iteration (e.g., D(k−1)) which can be utilized in calculations associated with the new iteration.

Detection component 150 can also include a selection component 320 that can be utilized to select an accuracy threshold level, $\epsilon$, which can be the desired level of accuracy for detection of reconstruction levels associated with the information read from the memory location. According to one aspect of the disclosed subject matter, the accuracy threshold level can be selected during manufacture. In accordance with one aspect of the disclosed subject matter, detection component 150 can employ an LBG algorithm and can select an accuracy threshold level to be utilized in accordance with the LBG algorithm.

Detection component 150 can further include an identification component 330 that can identify decision regions associated with a given set of reconstruction level values. The decision regions can be based on information associated with the binary sequence(s), or a subset thereof, associated with the read current received from the memory location during the read operation. For example, in accordance with one aspect of the disclosed subject matter, detection component 150 can employ an LBG algorithm, and the identification component 330 can identify decision regions utilizing the following equation: $V_i(k) = \{X: d(X, Y_i) < d(X, Y_j)$ for any j different from i$\}$, j=1, 2, ..., M, where $V_i$ can be the decision regions, X can be the incoming current signal, $Y_i$ can be a desired or optimal reconstruction levels for detection for the current iteration, i can correspond to an index, and j can correspond to an index.

Detection component 150 can further include a computation component 340 that can perform calculations associated with detecting the reconstruction levels of the memory cells in a memory (e.g., memory 130). Computation component 340 can compute a distortion level associated with the decision regions. The distortion level can then be used to determine whether the accuracy threshold has been reached. Further, computation component 340 can calculate the difference between the current distortion level and the previous distortion level (or, if no previous distortion level, then an initial distortion level) can be calculated and then divided by the current distortion level. If a determination is made that the result is less than the accuracy threshold level, the desired accuracy has been reached and the reconstruction levels for the memory cell are detected, where the reconstruction levels used during that iteration can be the final results.

In accordance with another aspect of the disclosed subject matter, computation component 340 can reference and utilize look-up tables associated with multiplication and division calculations, instead of performing such calculations, so that performing such calculations can be reduced or eliminated in order to optimize performance and reduce the cost of implementation.

In accordance with one embodiment of the disclosed subject matter, detection component 150 can employ an LBG algorithm, and the computation component 340 can calculate a distortion level associated with the decision regions. The distortion level, D(k), can be used to determine whether the accuracy threshold has been reached. For example, when employing the LBG algorithm, the distortion can be computed for each k, as follows:

$$D(k) = \sum_i \int_{Vi(k)} |X - Y|^2 f_X(X) dX$$

for i=1, 2, . . . , M, where $f_X(X)$ can be the probability distribution function of the signal.

Based on the distortion, a determination can be made as to whether the accuracy threshold, $\epsilon$, has been met. For example, when employing the LBG algorithm, computation component 340 can calculate: (D(k)−D(k−1))/D(k). If the result of this calculation is less than the accuracy threshold level, the desired accuracy has been reached and the reconstruction levels are detected, where the reconstruction levels used during that iteration can be the final results.

Detection component 150 can also employ a comparison component 350 that can analyze and compare the amount of change in the distortion level (e.g., (D(k)−D(k−1))/D(k)) to the accuracy threshold level to determine whether the amount of change in distortion level is more or less than the accuracy threshold level. If it is determined that the amount of change in the distortion level is less than the accuracy threshold level, the reconstruction levels in the memory cell are detected. If it is determined that the amount of change in the distortion level is greater than the accuracy threshold level, then the reconstruction levels in the memory cell are not yet detected, and increment component 360 can increment the iteration number by one, up to a predetermined maximum number of iterations, and detection component 150 can begin to perform another iteration with a new set of reconstruction levels that can be based on centroids associated with the decision regions of the previous iteration.

In accordance with one aspect of the disclosed subject matter, detection component 150 can employ an LBG algorithm and comparison component 350 can analyze and compare the amount of change in distortion levels with the accuracy threshold level using the following equation: (D(k)−D(k−1))/D(k)<$\epsilon$. If it is determined that the amount of change in the distortion level is less than the accuracy threshold level, the reconstruction levels in the memory cell are detected. If it is determined that the amount of change in the distortion level is greater than the accuracy threshold level, then the reconstruction levels in the memory cell are not yet detected, and increment component 360 can increment the iteration number by one, k=k+1, up to a predetermined maximum number of iterations, and detection component 150 can begin to perform another iteration with a new set of reconstruction levels that can be based on centroids associated with the decision regions of the previous iteration.

Increment component 360 can also maintain a count of the number of iterations performed, and can increment up to a predetermined maximum number of iterations. Once the maximum number of iterations has been performed without detecting the threshold values for the memory cell to the desired accuracy, detection component 150 can end the detection process. The reconstruction levels of the last iteration, even though suboptimal, can be chosen as the detected reconstruction levels.

Detection component 150 can further include an output component 370 that can output the detected reconstruction levels, whether such reconstruction levels are optimal or suboptimal. The output can be provided to the decision component 214, for example.

Figure 4:
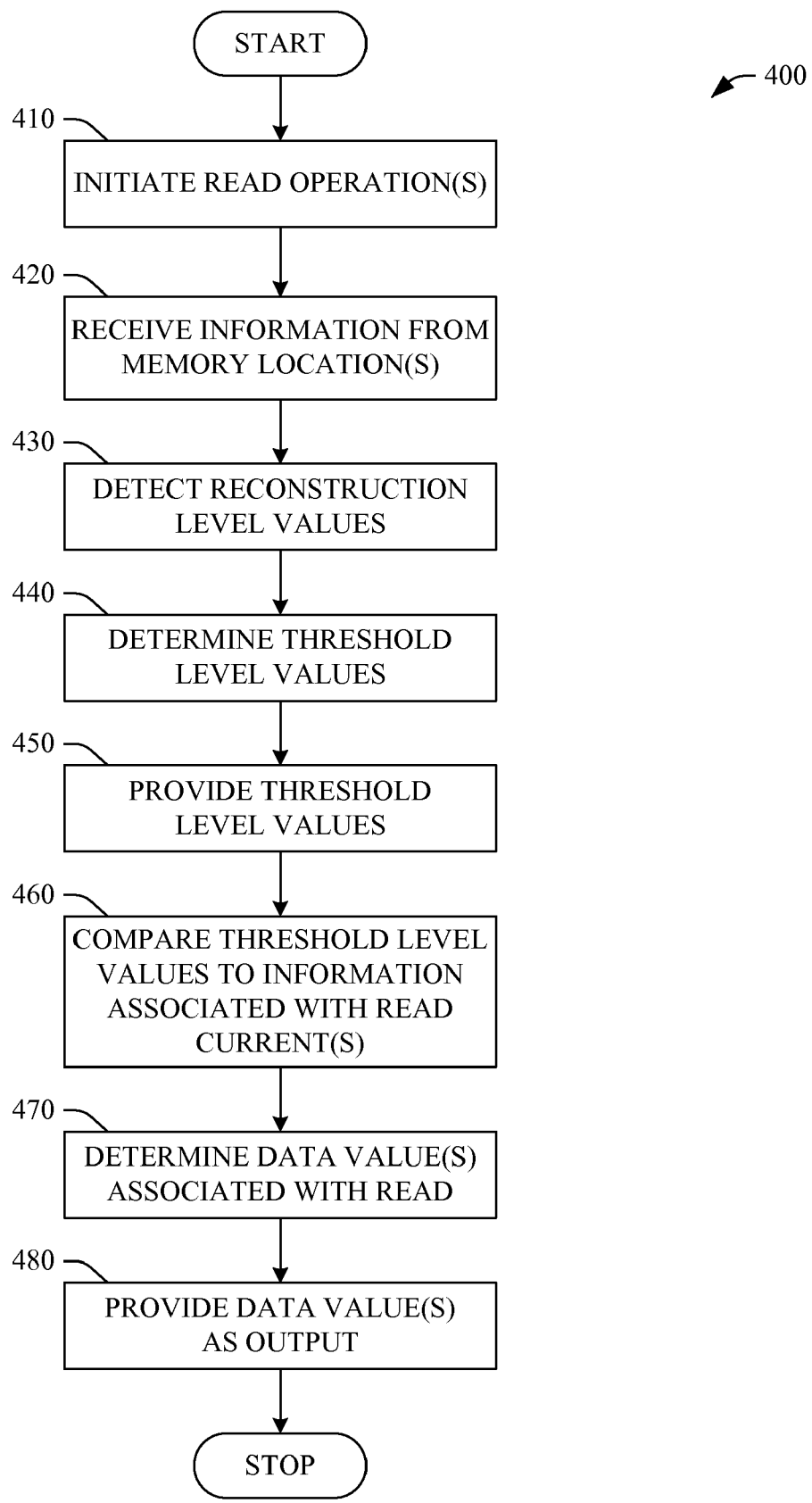
FIG. 4 illustrates a methodology that facilitates accessing data from a memory in accordance with an aspect of the disclosed subject matter.
Figure 5:
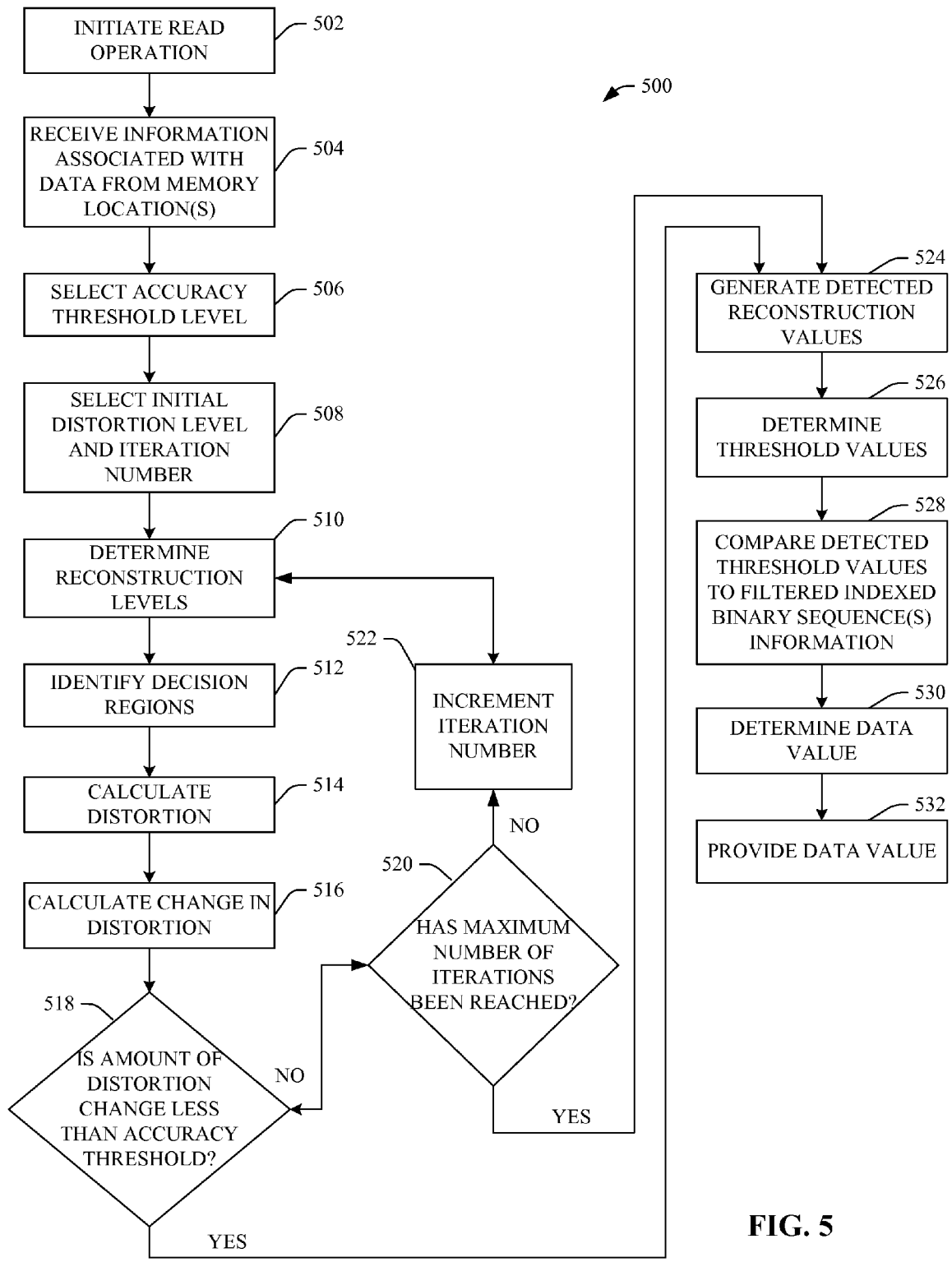
FIG. 5 illustrates a methodology that facilitates reading data from a memory in accordance with an aspect of the disclosed subject matter.
Figure 6:
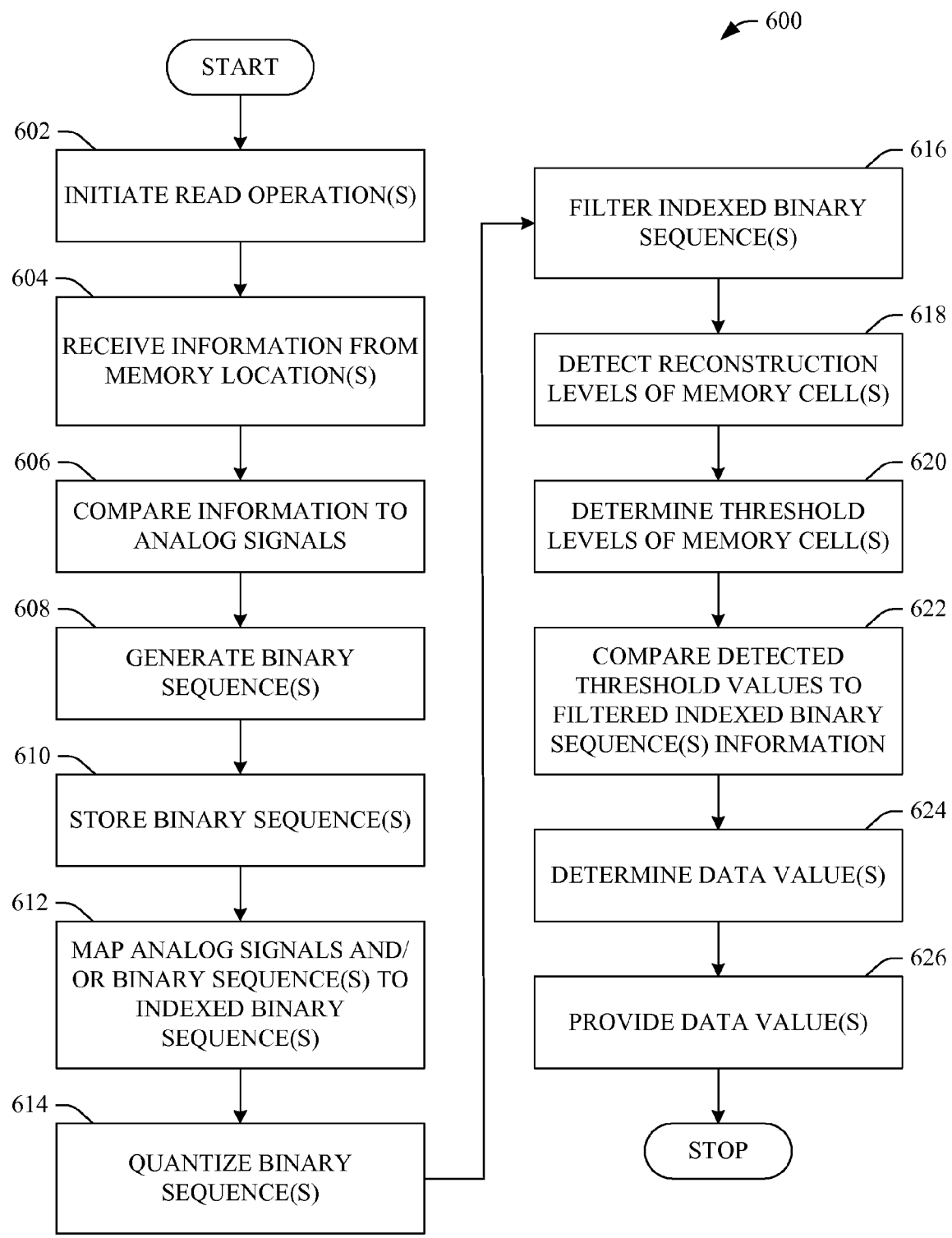
FIG. 6 illustrates a methodology that facilitates detecting threshold levels in a memory in accordance with an aspect of the disclosed subject matter.

FIGS. 4-6 illustrate methodologies in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring to FIG. 4, a methodology 400 for reading data from a memory is illustrated. At 410, a read operation(s) can be initiated to read data stored in a memory location(s) in a memory cell(s) in a memory device, such as a non-volatile memory device 130 (e.g., flash memory). For example, there can be data read from one or more memory cells in memory 130. The read operation(s) can include information associated with respective memory address(es) in memory 130 (e.g., non-volatile memory, such as flash memory) from which the data can be read. At 420, information (e.g., a current level) associated with respective piece(s) of data stored in memory address(es) can be received from the memory. At 430, one or more reconstruction levels associated with the memory cell(s) can be detected or determined based in part on the information associated with the data.

At 440, one or more threshold level values can be determined from the reconstruction levels. For example, a threshold level value can be a midpoint between two reconstruction levels. To further illustrate, assume the detected reconstruction levels are 0.0, 1.2, 2.4, and 3.6 mA. A first threshold level value can be the midpoint between 0.0 and 1.2 mA, which is 0.6 mA; a second threshold level value can be the midpoint between 1.2 and 2.4 mA, which is 1.8 mA; and a third threshold level value can be the midpoint between 2.4 and 3.6 mA, which 3.0 mA. At 450, the one or more detected threshold levels can be provided as an output, for example, to be sent to a decision component (e.g., 214).

At 460, the one or more threshold levels can be compared to the information associated with each piece of data that was stored in a respective memory address in a respective memory cell in memory 130. At 470, a determination can be made as to the data value of the information associated with a respective piece of data, based on the comparison made at 460. Continuing with the above example, if there are three threshold levels, there can be four possible binary data values: 00 for a read value that is less than the first threshold level; 01 for a read value that is greater than or equal to the first threshold level, but less than the second threshold level; 10 for a read value that is greater than or equal to the second threshold level, but less than the third threshold level; and 11 for a read value that is greater than or equal to the third threshold value. To further illustrate, using the reconstruction levels and threshold values from the above example, if, for example, the value of a particular piece of information read from a memory address is 1.6 mA, that value can correspond to a binary data value of 01, since it exceeds the first threshold level value, but does not exceed the second threshold level value of 1.8 mA. If the read value had been 1.9 mA, such value can correspond to a binary data value of 10, since 1.9 mA exceeds the second threshold level, but is less than the third threshold level of 3.0 mA.

At 480, respective binary data values for the data read from the memory cells can be output, for example, from the decoder component 140 to a host processor (e.g., 110). At this point, methodology 400 ends.

Turning to FIG. 5, a methodology 500 that facilitates detecting threshold levels associated with a memory is illustrated. At 502, a read operation can be initiated to read data stored in a memory address in a memory cell in a memory device 130, such as a non-volatile memory device (e.g., flash memory). The read operation can include information associated with the memory address in memory from which the data is to be read. At 504, information associated with the data read from memory 130 can be received. The information can comprise a current level associated with the data stored in the memory address.

At 506, an accuracy threshold, $\epsilon$, can be selected, such that the reconstruction levels can be detected if the accuracy threshold level is met. In one aspect, the accuracy threshold can be a predetermined value. Further, in accordance with another aspect of the disclosed subject matter, an LBG algorithm can be employed for methodology 500 and the accuracy threshold can be used with such algorithm. At 508, an initial distortion level and an initial iteration number can be selected. In one aspect, during an initial iteration, when employing an LBG algorithm, the iteration value k can be set to 0, and the distortion value, D(0) can be set to 0, for example.

At 510, reconstruction level values can be determined, where the reconstruction level values that ultimately meet the required accuracy can be the detected reconstruction levels for the memory cell where the data was stored. During a first iteration of methodology 500, initial reconstruction levels can be determined based on information associated with the current level read from the memory address. In one aspect, when employing an LBG algorithm, the initial reconstruction levels can be stated as $\{Y_i(0)\}$, where i=1, . . . , M. If a subsequent iteration(s) is desired, a new set of reconstruction level values can be determined based on centroids associated with the decision regions of the previous iteration, for example.

At 512, decision region(s) can be identified and can be based on the information (e.g., quantized binary sequence(s)) associated with the current level read from the memory address. A particular decision region can be the area associated with one of the levels in memory cells of memory 130, where the level can be associated with a binary data value. A decision region can fall between a lower limit and the lowest threshold level of a memory cell; between two threshold levels of a memory cell; or between a highest threshold level and an upper limit associated with a memory cell, for example.

As an example, if given four reconstruction levels that are 0.5 mA, 1.5 mA, 2.5 mA, and 3.5 mA, respectively, such can yield three corresponding threshold levels at 1.0 mA, 2.0 mA, and 3.0 mA, which can be the midpoints between adjacent reconstruction levels. Four decision regions can be identified, for example, as a first region that can be the region that is up to 1.0 mA; a second decision region that can be the region between 1.0 mA and 2.0 mA; a third decision region that can be the region between 2.0 mA and 3.0 mA; and a fourth decision region that can be the region that is greater than 3.0 mA.

At 514, a distortion value can be calculated, where, for example, the distortion value can be based in part on the square of the absolute value of the distance between an optimal reconstruction level (e.g., currently detected reconstruction level that can be assumed by decision) and the received signal (e.g., input to the decision component 214). In one aspect, an LBG algorithm can be employed and the distortion level can be computed using the following equation, which can theoretically define the distortion:

$$D(k) = \sum_i \int_{Vi(k)} |X - Y|^2 f_X(X) dX$$

for i=1, 2, . . . , M, where $f_X(X)$ can be the probability distribution function of the signal.

At 516, an amount of change in the distortion value of the current iteration based on the distortion value of the previous iteration (or initial distortion value for a first iteration) can be determined. In one aspect, when employing an LBG algorithm, the amount of change in distortion can be calculated as follows: (D(k)−D(k−1))/D(k). At 518, the amount of change in distortion can be compared to the accuracy threshold level, and a determination can be made as to whether the accuracy threshold has been met. In one aspect, when employing the LBG algorithm, the comparison can be made using the following equation: (D(k)−D(k−1))/D(k)<$\epsilon$.

If, at 518, it is determined that the accuracy threshold level has not been met, then at 520, a determination can be made as to whether the maximum number of iterations has been reached. If, at 520, it is determined that the maximum number of iterations has been reached, the iterations can end, and the reconstruction levels associated with the last iteration, while possibly suboptimal, can be used as the detected reconstruction levels. However, if at 520 it is determined that the maximum number of iterations has not been reached, then, at 522, the iteration value, k, can be incremented, for example, k=k+1, and there is a return to 510 to determine a new set of reconstruction level values and perform a new iteration. The new set of reconstruction level values can be based on centroids associated with the decision regions of the previous iteration, for example.

Turning back to 518, if it is determined that the amount of change in the distortion level is less than the accuracy threshold level, then the reconstruction levels associated with the memory cell are detected. Further, as stated, if, at 520, the maximum iterations were reached without reaching the accuracy threshold level, the detected reconstruction levels can be the reconstruction levels associated with the last iteration. At 524, an output comprising the detected reconstruction values can be generated, where the detected reconstruction values can be the reconstruction level values of the current iteration. This output can be sent to a decision component (e.g., 214), for example.

At 526, the threshold level values for a memory cell(s) can be determined from the detected reconstruction values. For example, the threshold level values can be determined by identifying a midpoint between two adjacent reconstruction level values. For instance, if a first reconstruction level value is 0.6 mA and an adjacent reconstruction level value is 1.7 mA, then a threshold level value can be 1.15 mA (e.g., (0.6+1.7)/2=1.15 mA). Typically, for H reconstruction levels there can be H-1 threshold levels.

At 528, the threshold levels can be compared to a value associated with an indexed binary sequence. The binary sequence can be associated with the current level associated with the piece of data read from memory 130. Further, the binary sequence can be quantized and filtered prior to being compared to the threshold levels associated with the memory cell of memory 130. The threshold levels for the memory cell can be used to define decision regions that can be associated with the possible data values for data read from memory 130. For example, if there are four reconstruction levels, and thus three threshold levels, a first decision region can correspond to a binary data value of 00 and can range from 0 to the first threshold level; a second decision region can correspond to a binary data value of 01 and can range from the first threshold level to the second threshold level; a third decision region can correspond to a binary data value of 10 and can range from the second threshold level to the third threshold level; and a fourth decision region can correspond to a binary data value of 11, and can range from third threshold level and higher. At 530, a determination can be made as to the data value of the binary sequence associated with a respective piece of data, based on the comparison made at 528. Thus, for example, if a read value (e.g., value associated with an indexed binary sequence) is such that it falls in the second decision region, then it can correspond to a binary data value of 01.

Alternatively, data values for pieces of data read from memory can be determined by comparing each piece of data (values associated with a respective indexed binary sequence) to the detected reconstruction values. For example, the data value of a piece of data stored in a respective memory address can be determined based on the detected reconstruction value that is closest in value to the value associated with a corresponding binary sequence, for example. As an example, given detected reconstruction level values of 1.0, 2.0, 3.125, and 4.0 mA, and a binary sequence, associated with a current level read from a memory location, having a value of 2.75 mA, the data value of the data read from memory can be determined to be 3.125 mA, because detected reconstruction level of 3.125 mA is the closest value to the binary sequence data value.

At 532, the data value can be provided, for example, to a host processor (e.g. 110). At this point, methodology 500 ends.

Referring to FIG. 6, a methodology 600 for facilitating reading data from a memory is illustrated. At 602, a read operation(s) can be initiated to read data stored in a respective memory address in a memory cell in a memory device 130, such as a non-volatile memory device (e.g., flash memory). The read operation(s) can include information associated with the respective memory address in memory 130 from which the data is to be read. It is to be appreciated that data from more than one memory cell may be analyzed to facilitate reading data (e.g., determine threshold levels of a respective memory cell(s)).

At 604, information associated with the stored data can be received. The information can comprise a current level associated with the data stored in a respective memory address, for example. At 606, the information associated with the stored data can be compared to a specified number of fixed analog signals, where each analog signal can correspond to a given current level. For example, there can be N fixed analog signals, where N can be based on the resolution required by the low-pass filter 212, for example.

At 608, a binary sequence can be generated based on the comparison performed at 606, and can indicate which of the N-band analog signals are exceeded when compared with a value corresponding to the detected current level(s) associated with the stored data read from memory 130. As an example, assume there are eight analog signals from the signal component 204 with respective values of 1.0, 2.0, 3.0, 4.0, 5.0, 6.0, 7.0, and 8.0 mA, and the detected current from the memory cell in memory 130 corresponds to a value of 3.4 mA, comparing component 202 can generate a binary sequence of 0000 0111, since 3.4 mA exceeds 1.0, 2.0, and 3.0 mA, so a 1 can be generated as a bit of information corresponding to each of those comparisons by the comparing component 202, but 3.4 mA does not exceed 4.0, 5.0, 6.0, 7.0, and 8.0 mA, so a 0 can be generated as a bit of information corresponding to each of those comparisons by the comparing component 202 with respect to those signals.

At 610, the generated binary sequence(s) can be stored as each bit of the binary sequence is received. For example, the binary sequence data can be received by and stored in a buffer (e.g., 206). At 612, each of the generated binary sequences can be mapped to a corresponding indexed binary sequence of a plurality of indexed binary sequences that can be stored in a mapping table in digitizing component 208, for example. Each of the indexed binary sequences can be correspondingly associated with the fixed-point analog signals.

At 614, each indexed binary sequence (e.g., the binary sequence from 612, can be quantized to reduce the number of bits per indexed binary sequence, which can thereby reduce the work load of certain components (e.g., filter component 212). For example, if N bits are input to a quantization component 210, the quantization component can reduce the N bits to N', where N' can be less than N. The number of bits to be reduced can be predetermined and can be based on simulation or testing results, for example, such that reducing the number of bits to N' will not result in an unacceptable level of error in the accuracy of determining the threshold levels of the respective memory cells in memory 130.

At 616, each quantized binary sequence can be filtered to reduce or eliminate high-frequency noise and disturbance. Thus, P N'-bit binary sequences, which can be the P quantized binary sequences that can correspond to respective binary sequences from buffer component 206, can be filtered by filter component 212. For example, each quantized binary sequence can be passed through a low-pass filtering component. Such filtering can result in a more accurate representation of the threshold level values of the memory cell.

At 618, reconstruction level values associated with the memory cell(s) can be detected. For example, the reconstruction level values can be detected in accordance with the disclosed subject matter (e.g., methodology 500) and can be based on the binary sequence) data after filtering is performed, at 616. At 620, the threshold level values can be determined from the detected reconstruction values. For example, the threshold level values can be determined by identifying a midpoint between to adjacent reconstruction level values. Typically, for H reconstruction levels there can be H−1 threshold levels.

At 622, the detected threshold level values can be compared with the filtered and quantized binary sequence data. At 624, data values can be determined for each piece of data respectively stored in, and read from, memory addresses in the memory cells in the memory device 130. For example, reconstruction level values may be $R_1$=0.8 mA, $R_2$=1.7 mA, $R_3$=2.5 mA, and $R_4$=3.4 mA, for a certain P N'-bit binary sequences (e.g., filtered and quantized indexed binary sequences) associated with a certain P memory cells, as determined in accordance with the disclosed subject matter. Threshold level values (T) can be determined by finding the midpoint between adjacent reconstruction levels resulting in $T_{12}$=1.25 mA, $T_{23}$=2.1 mA, and $T_{34}$=2.95 mA. This can result in four decision regions (DRs) each respectively associated with a data value, where $DR_1$ can range from 0.0 mA to any value less than $T_{12}$, and can be associated with a binary data value of 00; $DR_2$ can range from any value greater than or equal to $T_{12}$ and less than $T_{23}$, and can be associated with a binary data value of 01; $DR_3$ can range from any value greater than or equal to $T_{23}$ and less than $T_{34}$, and can be associated with a binary data value of 10; and $DR_4$ can range from $T_{34}$ and higher, and can be associated with a binary data value of 11. A value associated with binary sequence data can be compared to the threshold level values to determine the decision region to which the binary sequence data corresponds and thereby determine the data value of such binary sequence data. For instance, indexed binary sequence data having a value corresponding to 1.85 mA can fall in $DR_2$ and thus can have a binary data value of 01.

It should be noted that, alternatively, the data value of the data read from the memory address can be determined based on the detected reconstruction level value that is closest in value to the value associated with a particular binary sequence associated with the data read from the memory address, for example. To further illustrate by example, given detected reconstruction level values of 1.0, 2.0, 2.875, and 4.0 mA, and a binary sequence having a value corresponding to 2.75 mA, the data value of the data read from memory 130 can be determined to be 2.875 mA, because detected reconstruction level of 2.875 mA is the closest value to the indexed binary sequence data value.

At 626, the data value representing the stored data read from memory 130 (e.g., data value associated with the corresponding indexed binary sequence) can be provided, for example, to a host processor (e.g., 110). At this point methodology 600 can end.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., CD, DVD . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Moreover, the word "exemplary" is used herein to mean serving as an example, instance, or illustration. Any aspect or design described herein as "exemplary" is not necessarily to be construed as preferred or advantageous over other aspects or designs.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 7:
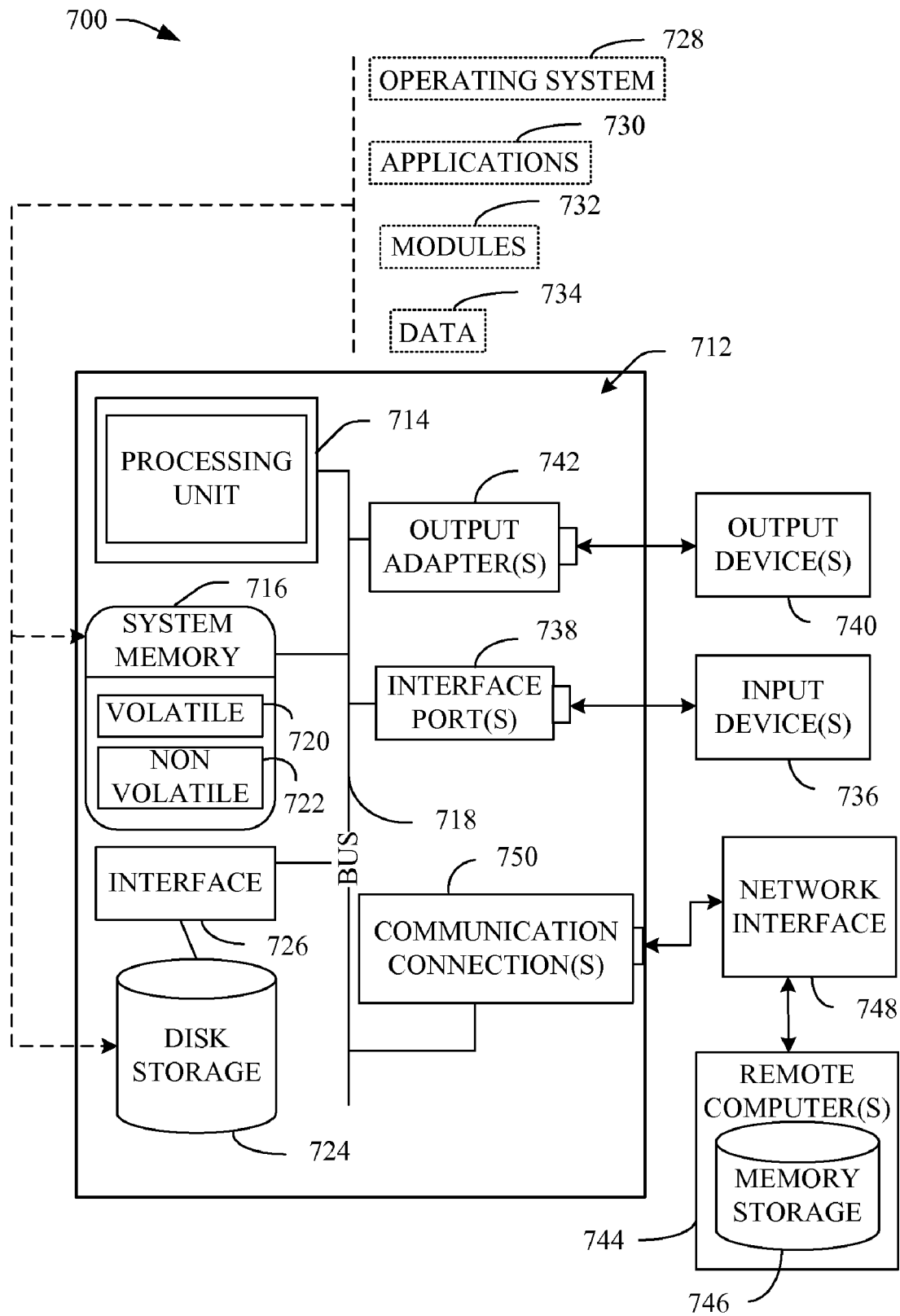
FIG. 7 is a schematic block diagram illustrating a suitable operating environment.
Figure 8:
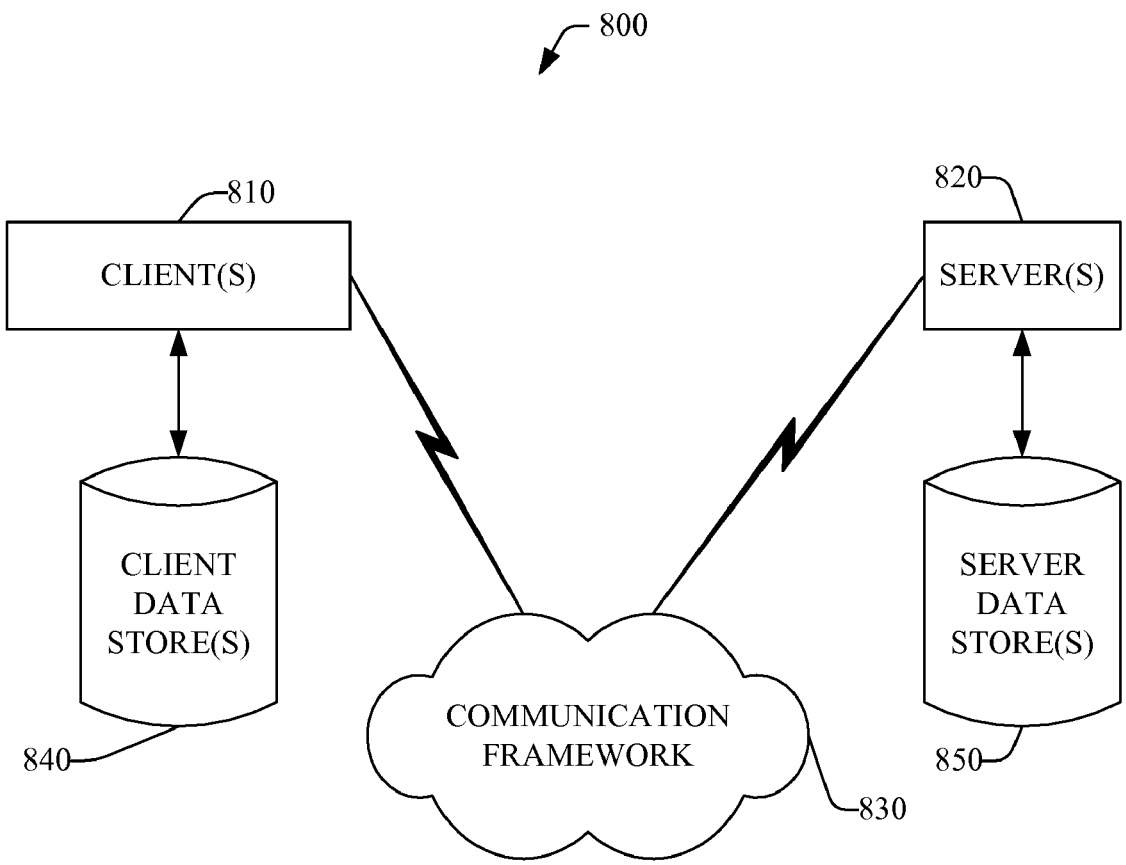
FIG. 8 is a schematic block diagram of a sample-computing environment.

In order to provide a context for the various aspects of the disclosed subject matter, FIGS. 7 and 8, as well as the following discussion, are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 7, a suitable environment 700 for implementing various aspects of the claimed subject matter can include a computer 712. The computer 712 includes a processing unit 714, a system memory 716, and a system bus 718. The system bus 718 couples system components including, but not limited to, the system memory 716 to the processing unit 714. The processing unit 714 can be any of various available processors. Dual microprocessors and other multiprocessor architectures also can be employed as the processing unit 714.

The system bus 718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 716 includes volatile memory 720 and nonvolatile memory 722. The basic input/output system (BIOS), containing the basic routines to transfer information between elements within the computer 712, such as during start-up, is stored in nonvolatile memory 722. By way of illustration, and not limitation, nonvolatile memory 722 can include ROM, PROM, electrically programmable ROM (EPROM), electrically erasable programmable ROM (EEPROM), or flash memory. Volatile memory 720 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 712 also includes removable/non-removable, volatile/non-volatile computer storage media. FIG. 7 illustrates, for example, a disk storage 724. Disk storage 724 includes, but is not limited to, devices like a magnetic disk drive, floppy disk drive, tape drive, Jaz drive, Zip drive, LS-100 drive, flash memory card, or memory stick. In addition, disk storage 724 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 724 to the system bus 718, a removable or non-removable interface is typically used, such as interface 726.

It is to be appreciated that FIG. 7 describes software that acts as an intermediary between users and the basic computer resources described in the suitable operating environment 700. Such software includes an operating system 728. Operating system 728, which can be stored on disk storage 724, acts to control and allocate resources of the computer system 712. System applications 730 take advantage of the management of resources by operating system 728 through program modules 732 and program data 734 stored either in system memory 716 or on disk storage 724. It is to be appreciated that the disclosed subject matter can be implemented with various operating systems or combinations of operating systems.

A user enters commands or information into the computer 712 through input device(s) 736. Input devices 736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 714 through the system bus 718 via interface port(s) 738. Interface port(s)

738 include, for example, a serial port, a parallel port, a game port, and a universal serial bus (USB). Output device(s) 740 use some of the same type of ports as input device(s) 736. Thus, for example, a USB port may be used to provide input to computer 712, and to output information from computer 712 to an output device 740. Output adapter 742 is provided to illustrate that there are some output devices 740 like monitors, speakers, and printers, among other output devices 740, which require special adapters. The output adapters 742 include, by way of illustration and not limitation, video and sound cards that provide a means of connection between the output device 740 and the system bus 718. It should be noted that other devices and/or systems of devices provide both input and output capabilities such as remote computer(s) 744.

Computer 712 can operate in a networked environment using logical connections to one or more remote computers, such as remote computer(s) 744. The remote computer(s) 744 can be a personal computer, a server, a router, a network PC, a workstation, a microprocessor based appliance, a peer device or other common network node and the like, and typically includes many or all of the elements described relative to computer 712. For purposes of brevity, only a memory storage device 746 is illustrated with remote computer(s) 744. Remote computer(s) 744 is logically connected to computer 712 through a network interface 748 and then physically connected via communication connection 750. Network interface 748 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 750 refers to the hardware/software employed to connect the network interface 748 to the bus 718. While communication connection 750 is shown for illustrative clarity inside computer 712, it can also be external to computer 712. The hardware/software necessary for connection to the network interface 748 includes, for exemplary purposes only, internal and external technologies such as, modems including regular telephone grade modems, cable modems and DSL modems, ISDN adapters, and Ethernet cards.

FIG. 8 is a schematic block diagram of a sample-computing environment 800 with which the subject innovation can interact. The system 800 includes one or more client(s) 810. The client(s) 810 can be hardware and/or software (e.g., threads, processes, computing devices). The system 800 also includes one or more server(s) 820. Thus, system 800 can correspond to a two-tier client server model or a multi-tier model (e.g., client, middle tier server, data server), amongst other models. The server(s) 820 can also be hardware and/or software (e.g., threads, processes, computing devices). The servers 820 can house threads to perform transformations by employing the subject innovation, for example. One possible communication between a client 810 and a server 820 may be in the form of a data packet transmitted between two or more computer processes.

The system 800 includes a communication framework 830 that can be employed to facilitate communications between the client(s) 810 and the server(s) 820. The client(s) 810 are operatively connected to one or more client data store(s) 840 that can be employed to store information local to the client(s) 810. Similarly, the server(s) 820 are operatively connected to one or more server data store(s) 850 that can be employed to store information local to the servers 820.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates accessing data in a memory, comprising:
    the memory stores data and is comprised of one or more memory cells, wherein the one or more memory cells each have one or more threshold level values that respectively correspond with one or more data values; and
    a detection component that adaptively detects one or more reconstruction levels associated with the one or more threshold level values.

2. The system of claim 1, further comprising:
    a host processor that generates operations that are executed on the memory, the operations comprise at least read operations.

3. The system of claim 1, the detection component employs a Linde-Buzo-Gray (LBG) algorithm to adaptively detect the one or more reconstruction level values.

4. The system of claim 1, further comprising a decoder component that receives one or more current levels each associated with a respective piece of data stored in one or more respective memory locations associated with the one or more memory cells, and, for each of the one or more current levels, compares a particular current level with one or more fixed analog signals to generate a binary sequence associated with the particular current level, so there are one or more binary sequences that respectively correspond to the one or more current levels.

5. The system of claim 4, further comprising:
    a digitizing component that generates a mapping table, maps at least one of a binary sequence or a fixed analog signal, or a combination thereof, corresponding to the particular current level, to an indexed binary sequence in the mapping table, and generates an indexed binary sequences that corresponds to the binary sequence associated with the particular current level; and
    a quantization component that receives the indexed binary sequence, quantizes the indexed binary sequence, and correspondingly generates a quantized indexed binary sequence, so there are one or more quantized indexed binary sequences respectively associated with the one or more current levels.

6. The system of claim 5, further comprising a filter component that receives the one or more quantized indexed binary sequences and filters out high-frequency noise and disturbances in the one or more quantized indexed binary sequences.

7. The system of claim 6, the filter component further comprises one or more subfilters that are each respectively associated with each of one or more states associated with the memory cell, wherein each of the one or more states is determined based on two threshold levels respectively associated with two memory locations.

8. The system of claim 6, the detection component receives the one or more quantized indexed binary sequences, as filtered, from the filter component and determines a subset of reconstruction level values based on the one or more quantized indexed binary sequences, finds decision regions associated with the one or more quantized indexed binary sequences, computes a distortion value associated with the decision regions and reconstruction levels, determines if an amount of change in distortion is below a predetermined accuracy threshold level value, and, if the amount of change in distortion is below the predetermined accuracy threshold level value, derives one or more threshold level values that correspond to the one or more detected reconstruction level values and generates an output comprising the one or more threshold level values and the one or more detected reconstruction level values.

9. The system of claim 8, further comprising a decision component that receives information associated with the one or more quantized indexed binary sequences, receives the one or more threshold level values associated with the one or more memory cells, and compares information associated with each of the one or more quantized indexed binary sequences to the one or more threshold level values to determine a binary data value that represents the piece of data associated therewith.

10. The system of claim 1, the memory is non-volatile memory comprising at least one of flash memory, read only memory (ROM), programmable ROM (PROM), erasable programmable read only memory (EPROM), or electronically erasable programmable read only memory (EEPROM), or a combination thereof.

11. A device comprising the system of claim 1, the device further comprising at least one of a computer, a personal digital assistant, a cellular phone, a digital phone, an answering machine, a video device, a television, a digital versatile diskplayer/recorder, a music player/recorder, an MP3 player, a digital recorder, a digital camera, a microwave oven, an electronic organizer, an electronic toy, an electronic game, a scanner, a reader, a printer, a copy machine, or a facsimile machine.

12. A method for accessing data from a memory, comprising:
generating an operation to be executed in a memory cell in the memory, the operation comprising at least a read operation;
receiving a current level associated with the memory cell; and
adaptively detecting one or more reconstruction level values, associated with the memory cell, that respectively correspond to one or more data values.

13. The method of claim 12, further comprising:
determining one or more threshold level values based on the one or more reconstruction level values;
providing the one or more threshold level values;
comparing the one or more threshold level values with information associated with the current level;
determining one or more data values; and
providing the one or more data values.

14. The method of claim 12, further comprising:
determining one or more initial reconstruction levels based on the current level;
selecting an initial distortion level, iteration number, and accuracy threshold level;
identifying one or more decision regions;
calculating a distortion level associated with the one or more reconstruction levels; and
calculating an amount of change in distortion level.

15. The method of claim 14, further comprising:
determining if an amount of change in distortion level is less than an accuracy threshold level value; and
generating one or more reconstruction level values, if an amount of change in distortion level is less than the accuracy threshold level value; or
determining if a maximum number of iterations has been performed, if the amount of change in distortion level is greater than or equal to the accuracy threshold level value.

16. The method of claim 15, further comprising:
generating an output comprising one or more reconstruction level values associated with a current iteration, if the maximum number of iterations have been performed; or
incrementing an iteration count if a maximum number of iterations has not been performed; and
determining one or more new reconstruction level values that are centroids associated with one or more decision regions associated with a previous iteration.

17. The method of claim 12, further comprising:
comparing the current level with one or more analog signals;
generating one or more binary sequences;
storing the one or more binary sequences;
mapping the one or more binary sequences to one or more other binary sequences that respectively correspond to the one or more binary sequences; and
generating the one or more other binary sequences.

18. The method of claim 17, further comprising:
quantizing the one or more other binary sequences;
generating one or more quantized other binary sequences; and filtering the one or more quantized other binary sequences.

19. A system for facilitating reading data from a memory, comprising:
means for receiving a signal associated with data stored in the memory; and
means for adaptively detecting one or more reconstruction levels, associated with the signal, that correspond to one or more threshold levels that respectively correspond to one or more data values.

20. The system of claim 19, further comprising:
means for determining one or more reconstruction levels associated with the signal;
means for selecting an accuracy threshold level;
means for identifying one or more decision regions;
means for calculating a distortion level;
means for calculating an amount of change in distortion level;
means for determining if the amount of change in distortion level is below the accuracy threshold level; and
means for generating one or more detected reconstruction levels, if the amount of change in distortion level is below the accuracy threshold level or if a maximum number of iterations have been performed.

* * * * *